United States Patent
Sakamoto et al.

(10) Patent No.: US 6,551,427 B2
(45) Date of Patent: *Apr. 22, 2003

(54) METHOD FOR MANUFACTURING CERAMIC SUBSTRATE AND NON-FIRED CERAMIC SUBSTRATE

(75) Inventors: Sadaaki Sakamoto, Shiga-ken (JP); Hirofumi Sunahara, Moriyama (JP)

(73) Assignee: Murata Manufacturing Co. Ltd. (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/096,415

(22) Filed: Mar. 11, 2002

(65) Prior Publication Data

US 2002/0150743 A1 Oct. 17, 2002

Related U.S. Application Data

(63) Continuation of application No. 09/584,317, filed on May 31, 2000, now Pat. No. 6,395,118.

(30) Foreign Application Priority Data

Jun. 16, 1999 (JP) .......................................... 11-170002
Apr. 27, 2000 (JP) ........................................ 2000-128369

(51) Int. Cl.⁷ ........................... B32B 31/26; C04B 35/64
(52) U.S. Cl. ............................ 156/89.12; 156/89.16; 156/289; 264/619; 428/210; 428/901
(58) Field of Search .................... 156/89.12, 89.16, 156/289; 264/619; 428/210, 901

(56) References Cited

U.S. PATENT DOCUMENTS

| | | | |
|---|---|---|---|
| 5,085,720 A | 2/1992 | Mikeska et al. | |
| 5,130,067 A | 7/1992 | Flaitz et al. | |
| 5,139,975 A | 8/1992 | Herron et al. | |
| 5,277,723 A | * 1/1994 | Kodama et al. | |
| 5,370,759 A | 12/1994 | Haotani et al. | |
| 5,456,778 A | 10/1995 | Fukuta et al. | |
| 5,470,412 A | 11/1995 | Fukuta et al. | |
| 5,474,741 A | 12/1995 | Mikeska et al. | |
| 5,708,570 A | * 1/1998 | Polinski, Sr. | |
| 5,855,711 A | 1/1999 | Araki et al. | |
| 6,042,667 A | 3/2000 | Adachi et al. | |
| 6,139,666 A | 10/2000 | Fasano et al. | |
| 6,228,196 B1 | 5/2001 | Sakamoto et al. | |
| 6,241,838 B1 | 6/2001 | Sakamoto et al. | |
| 6,337,123 B1 | * 1/2002 | Ryugo et al. | |
| 6,395,118 B1 | * 5/2002 | Sakamoto et al. | 156/89.12 |

FOREIGN PATENT DOCUMENTS

EP 0591733 4/1994

(List continued on next page.)

OTHER PUBLICATIONS

Copy of Korean Office Action dated Dec. 30, 2002.
Abstract of JP 06–326470.

*Primary Examiner*—Curtis Mayes
(74) *Attorney, Agent, or Firm*—Dickstein, Shapiro, Morin & Oshinsky, LLP.

(57) ABSTRACT

The present invention provides a method for readily and efficiently manufacturing a ceramic substrate having an excellent dimensional accuracy and small degree of warp comprising the steps of: preparing a non-sintered multilayer ceramic body formed by laminating ceramic layers and conductor layers; forming a multilayer ceramic body with constraint layers by adhering a first constraint layer and a second constraint layer on one major surface and the other major surface, respectively, of the multilayer ceramic body, the first and second constraint layers being prepared by dispersing a ceramic powder that is not sintered under the sintering condition of the multilayer ceramic body; firing the multilayer ceramic body with the constraint layers under the firing condition of the multilayer ceramic body; and removing the first constraint layer and the second constraint layer after sintering the multilayer ceramic body, wherein the thickness of the first constraint layer is made to be larger than the thickness of the second constraint layer, and the first constraint layer is provided on one major surface that is more largely contracted by firing.

19 Claims, 5 Drawing Sheets

FOREIGN PATENT DOCUMENTS

| | | |
|---|---|---|
| JP | 4-243978 | 9/1992 |
| JP | 5-163072 | 6/1993 |
| JP | 5-503498 | 6/1993 |
| JP | 6-125171 | 5/1994 |
| JP | 6-326470 | 11/1994 |
| JP | 6-329476 | 11/1994 |
| JP | 7-330445 | 12/1995 |
| JP | 9-64230 | 3/1997 |
| JP | 9-92983 | 4/1997 |

* cited by examiner

METHOD FOR MANUFACTURING CERAMIC SUBSTRATE AND NON-FIRED CERAMIC SUBSTRATE

This is a continuation of application U.S. Ser. No. 09/584,317, filed May 31, 2000, now U.S. Pat. No. 6,395,118.

BACKGROUND OF THE INVENTION

1. Field of the Invention

The present invention relates to a method for manufacturing a ceramic substrate, particularly to a method for manufacturing a ceramic multilayer substrate capable of surface-mounting an active member such as a semiconductor integrated circuit member and a passive member such as a capacitor and an inductor.

2. Description of the Related Art

Ceramic multilayer substrates for mounting chips of electronic members such as semiconductor integrated circuit members (semiconductor devices) as well as chip capacitors and chip inductors are desired to have a highly integrated wiring among high-precision integrated passive members in order to mount the semiconductor devices and the chips of the electronic members in high density. In addition, a low temperature firing type multilayer ceramic green sheet has been developed for complying with ever growing recent requirements of highly integrated packaging and high operation frequencies, wherein a plurality of insulation ceramic green sheets having a relative dielectric constant of 15 or less, on which conductor patterns comprising low resistance materials such as Ag, Ag—Pd, Cu and Au are formed, are laminated, and the laminated ceramic green sheets are fired all at once at a temperature as low as 1000° C. or below.

Japanese Unexamined Patent Application Publication No. 5-163072 discloses a method for enabling a highly integrated wiring of the ceramic multilayer substrate, wherein a multilayer ceramic body is subjected to firing while applying a relatively large pressure from the upward and downward of the non-sintered ceramic body. Japanese Unexamined Patent Application Publication No. 4-243918 also discloses a method comprising the steps of: laminating and press-bonding constraint ceramic green sheets, which are not sintered under the firing conditions of the non-sintered ceramic body, on both upper and lower major surfaces of the non-sintered ceramic body prepared by laminating a plurality of ceramic green sheets capable of being fired at a low temperature; firing the ceramic green sheets under a sintering condition of the non-sintered ceramic body; and peeling and removing non-sintered layers derived from the constraint ceramic green sheets.

According to the methods described above, the ceramic multilayer substrate can be formed with a quite high dimensional accuracy, because firing contraction along the directions on the plane of the non-sintered ceramic body, or along the directions on the X-Y plane of the substrate, may be sufficiently suppressed. In other words, the highly integrated wiring hardly causes short-circuits while allowing various kinds of packaging members to be mounted with high precision in the ceramic multilayer substrate obtained.

However, a special equipment for firing under a pressure is required in the former method described above since the multilayer ceramic body is fired while applying a relatively large pressure, leaving a problem in the facility cost and manufacturing efficiency. Although a pressure is not always required for firing in the latter method, it is a problem that the multilayer ceramic body is liable to be warped due to differences of the degree of integration of wiring and the contraction behavior during firing between the upper layer and lower layer relative to the center face located at an equal distance from one major surface and the other major surface of the non-sintered ceramic body.

The number of input-output (I/O) terminals for mounting on and connecting to a mother board has been rapidly increased in the ceramic multilayer substrate as the wiring pattern is highly integrated in recent years. Also, the multilayer ceramic body is required to have highly integrated and accurate circuit elements such as capacitors and inductors since a number of highly precise circuit elements are needed for multi-functional and high performance ceramic multilayer substrate. Under these circumstances, a difference in the degree of contraction is liable to be caused between one major surface and the other major surface of the non-sintered ceramic body, generating a concave warp on the major surface side that is able to largely contract when no pressure is applied during firing.

Japanese Unexamined Patent Application Publication Nos. 5-503498 and 9-92983 disclose the methods in which constraint ceramic green sheets are adhered onto both major surfaces of the multilayer ceramic body in order to limit the degree of warp of the ceramic multilayer substrate within a given range, and the multilayer ceramic green sheet is fired while optionally applying a uniaxial load along the vertical direction (Z-direction) of the multilayer ceramic body. The multilayer ceramic body should be pressed with or through porous plates in the treatments as described above, so that volatilization of organic binders contained in the multilayer ceramic body and constraint ceramic green sheets are not blocked.

However, a special equipment for firing under a load is also required in the method described above as in the methods as hitherto described, leaving some problems in the facility cost and production efficiency. In addition, since the non-sintered ceramic body is forcibly pressed using a porous plate, portions suffering a load and not suffering a load are distributed on the surface of the multilayer ceramic body with fine pitches corresponding to the pores on the porous plate, causing fine projections and depressions with the foregoing pitches on the ceramic multilayer substrate obtained.

SUMMARY OF THE INVENTION

To overcome the above described problems, preferred embodiments of the present invention provides a method for readily and efficiently manufacturing a ceramic substrate having an excellent dimensional accuracy by suppressing deformation of the substrate such as warp of the substrate.

One preferred embodiment of the present invention provides a method for manufacturing a ceramic substrate having conductor patterns, comprising: adhering a first constraint layer on a first major surface of a non-sintered ceramic body, the first constraint layer being mainly composed of a first inorganic powder that is not sintered under the sintering condition of the non-sintered ceramic body; adhering a second constraint layer on a second major surface of the non-sintered ceramic body, the second constraint layer being mainly composed of a second inorganic powder that is not sintered under the sintering condition of the non-sintered ceramic body; and removing each of the first and second constraint layers after firing the non-sintered ceramic body under the sintering condition of the non-sintered ceramic body; wherein the first constraint layer and the second constraint layer are made to have different rigidity one another.

According to the above, since the first constraint layer and the second constraint layer are made to be the layers having different rigidities one another in the foregoing non-contraction process, the rigidities of the first constraint layer and the second constraint layer may be selected so as to suppress deformation of the ceramic substrate caused by firing. Accordingly, the ceramic substrate having an excellent dimensional accuracy can be easily and efficiently obtained by suppressing deformation of the substrate such as warp of the substrate, along with suppressing firing contraction along the directions on the substrate plane.

Preferably, the first constraint layer is made to have a higher rigidity than the rigidity of the second constraint layer, in order to allow the first constraint layer to adhere on one major surface side that is able to be largely contracted by firing. Since the first constraint layer having a higher rigidity is allowed to adhere on one side of the major surface that may be largely contracted by firing, warp and distortion of the substrate ascribed to the difference of the degree of contraction between one major surface side and the other major surface side can be sufficiently suppressed. This mean that the ceramic green sheet having an excellent dimensional accuracy can be, readily and efficiently manufactured without using any special firing equipment by sufficiently suppressing deformation of the substrate.

The phrase "the constraint layer having a high rigidity" as used herein refers to a constraint layer having a large deformation resistance against the non-sintered ceramic body during firing. The phrase "one major surface side that is able to be largely contracted by firing" refers to a side where wiring patterns are highly integrated, a side having an early onset temperature of contraction of the ceramic layer, or a side having a larger shrinkage ratio of the ceramic layer with respect to the center face located at an equal distance from one major surface side and the other major surface side of the non-sintered ceramic body. The one major surface side described above also corresponds to the side where concave warp may be caused after firing when no constraint layer are formed or when rigidity of the constraint layer is insufficient.

DESCRIPTION OF THE PREFERRED EMBODIMENT

Figure 1:
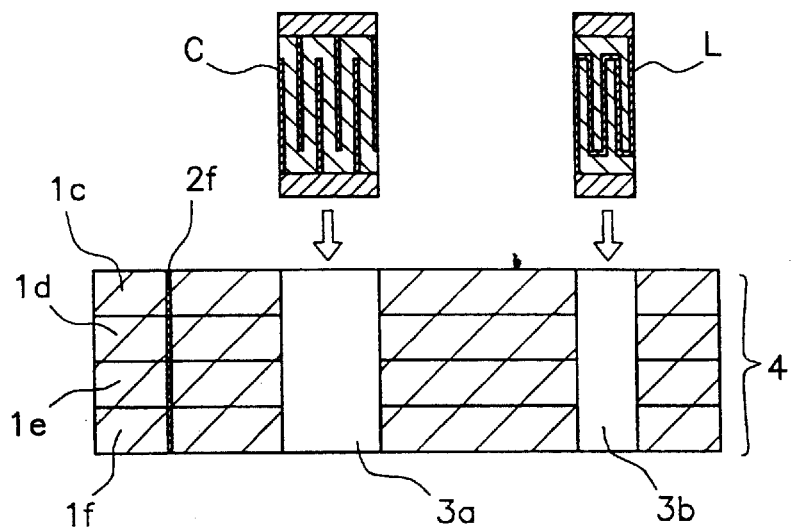
FIG. 1 shows an illustrative cross section for inserting the block members into the laminated body in the manufacturing process of the ceramic multilayer substrate according to the first embodiment.

The method for making the rigidity of the first constraint layer to be higher than the rigidity of the second constraint layer will be described below. Firstly, the rigidity of the first constraint layer is made to be higher than the rigidity of the second constraint layer by forming the first constraint layer to be thicker than the second constraint layer (referred as the first method hereinafter). Since rigidity of the constraint layer is enhanced as its thickness is increased, the rigidity of the first constraint layer may be made to be higher than the rigidity of the second constraint layer by allowing the first constraint layer to be thicker than the second constraint layer.

The thickness of each constraint layer may be appropriately adjusted during the process for forming a constraint layer composition, prepared by dispersing an inorganic powder that is not sintered under the sintering condition of the non-sintered ceramic body into an organic binder, into a sheet by a casting method or a doctor blade method, when the constraint layer comprises the ceramic green sheet. Alternatively, the thickness may be adjusted by laminating a plurality of the ceramic green sheets. When a paste of the constraint layer composition is coated on both major surfaces of the non-sintered ceramic body, on the other hand, the coating thickness or the coating times may be appropriately adjusted.

The first constraint layer is desirably formed to have a thickness three times or less as large as the thickness of the second constraint layer in the first method, because the effect of allowing the thicknesses of respective constraint layers to be different one another is scarcely displayed when the thickness of the first constraint layer exceeds three times or more of the thickness of the second constraint layer. Or, the balance of the constraint force brought about by the constraint layers is destroyed to unable contraction of the non-sintered ceramic body along the directions on the plane to be fully suppressed. Therefore, the more desirable thickness of the first, constraint layer should be adjusted to be 1.1 to 1.6 times as large as the thickness of the thickness of the second constraint layer, when the dimensional accuracy and the degree of warp of the substrate, and volatility of the organic binder are taken into account.

It is made possible to depress the cost required for forming the constraint layer besides allowing the constraint layer to be quite easily peeled and removed after firing, by minimizing the thickness of the constraint layer required for the non-contraction process, thereby enabling the manufacturing efficiency of the ceramic substrate to be improved. In addition, a high quality ceramic substrate may be manufactured within a short period of the firing time with less firing irregularities by suppressing generation of pores caused by residues of the organic binder, since the organic binder in the non-sintered ceramic body and in the constraint layer can be smoothly volatilized.

The thicknesses of the first constraint layer and the second constraint layer are variable depending on various factors such as the material and the number of the ceramic layers, and the material, the degree of integration and the number of the layers of the wiring patterns. In other words, the first constraint layer and the second constraint layer having optimum thicknesses may be appropriately selected depending on the extent of the deformation of the substrate such as the degree of warp and distortion.

Secondly, the mean particle size of the inorganic power in the first constraint layer is made to be smaller than the mean particle size of the inorganic power in the second constraint layer (referred as the second method hereinafter). Since rigidity of the constraint layer is enhanced as the mean particle size of the inorganic powder as a principal component of the constraint layer is reduced, the first constraint layer may have a higher rigidity than the rigidity of the second constraint layer by selecting the mean particle size of the inorganic powder in the first constraint layer to be smaller than that of the inorganic powder in the second constraint layer.

It is practically desirable that the mean particle size of the inorganic powder in the first constraint layer be within a range of 0.2 to 0.8 $\mu$m while the mean particle size of the inorganic powder in the second constraint layer be within a range of 1.0 to 5.0 $\mu$m. With resect to the specific surface area of the inorganic powder, it is desirably within a range of 4.0 to 10.0 m$^3$/g and 1.5 to 5.0 m$^3$/g, respectively, in the first constraint layer and second constraint layer. The rigidity of the first constraint layer may be also made to be different from the rigidity of the second constraint layer, by using different kinds of the inorganic powders in respective first and second constraint layers.

Thirdly, the content of the organic binder in the first constraint layer is adjusted to be larger than the content of the organic binder in the second constraint layer (referred as the third method hereinafter). When the first constraint layer and the second constraint layer comprise an inorganic powder dispersed in an organic binder, the rigidity of the constraint layer may be higher as the content of the organic binder is smaller. Consequently, the rigidity of the first constraint layer turns out to be higher than the rigidity of the second constraint layer when the first constraint layer contains less organic binder than the second constraint layer does. It is desirable that the first constraint layer contains 5 to 10 parts by weight of the organic binder and the second constraint layer contains 8 to 13 parts by weight of the organic binder relative to 100 parts by weight of the inorganic powder, when the same quantity of the inorganic powder is used in the third method.

Fourth, the first constraint layer contains fibrous inorganic oxide particles (referred as the fourth method hereinafter). Since the fibrous inorganic oxide particles contained in the constraint layer allows the rigidity of the constraint layer to be higher, the rigidity of the first constraint layer may be adjusted to be higher than the rigidity of the second constraint layer by allowing the fibrous inorganic oxide particles to be contained in the first constraint layer, or by adjusting the content of the fibrous inorganic oxide particles in the first constraint layer to be higher than the content of the fibrous inorganic oxide particles in the second constraint layer. Ceramic particles such as zirconia or alumina particles may be used for the fibrous inorganic oxide particles, wherein the ceramic particles have a favorable length of the longitudinal axis of about 3 to 500 $\mu$m.

Fifth, the first constraint layer contains a glass powder that does not exhibit viscous fluidity at the sintering temperature of the non-sintered ceramic body (referred as the fifth method hereinafter). Since the constraint layer may have a higher rigidity by allowing the glass powder to be contained in the layer, the rigidity of the first constraint layer may be adjusted to be higher than the rigidity of the second constraint layer by allowing the glass powder to be contained in the first constraint layer, or by adjusting the content of the glass powder in the first constraint layer to be higher than the content of the glass powder in the second constraint layer.

However, since the constraint layer may be largely contracted due to viscous fluidity of the glass depending on the kind and quantity of the glass powder, it is desirable that a glass material that does not show viscous fluidity at the sintering temperature of the non-sintered ceramic body is selected as the glass powder to be incorporated into the constraint layer, besides adjusting the content of the glass powder to an extent not causing viscous fluidity (an amount that does not allow the constraint layer to contract). The rigidity of the constraint layer can be practically enhanced to a desirable level while suppressing contraction of the constraint layer itself, by allowing the glass powder (for example, a silicate glass powder) having a softening temperature of 800° C. or above to be contained in the constraint layer when the non-sintered ceramic body has a sintering temperature of about 900 to 1000° C.

While the methods for making the first constraint layer to have higher rigidity than that of the second constraint layer have been hitherto described, an appropriate combination among the first to fifth methods may be applied in the present invention. Various combinations of the methods are possible such as, for example, allowing the thickness of the first constraint layer to be larger than the thickness of the second constraint layer, besides making the mean particles size of the inorganic powder in the first constraint layer to be smaller than the mean particles size of the inorganic powder in the second constraint layer.

The first and second constraint layers may desirably comprise the ceramic green sheet prepared by dispersing the inorganic powder into the organic binder. An inorganic oxide powder such as alumina, zirconia, magnesia, mulllite and quartz, and a non-oxide inorganic powder such as boronitride may be practically used for the first and second constraint layers. For example, a ceramic green sheet, in which the inorganic oxide powder is dispersed in an organic powder volatile during firing of the non-sintered ceramic body, is favorably used as a constraint layer composition for forming into a sheet.

As hitherto described, the first constraint layer and the second constraint layer are not necessarily restricted for use as green sheets, but they may comprise the layers formed by coating a paste composition, or may be formed by a spray or immersion method. Otherwise, a plasticizer, a parting agent, a dispersing agent, or a peeling agent may be added into the constraint layer composition.

At least one kind of the passive member selected from a group consisting of a capacitor, an inductor and a resistor may be integrated into the non-sintered ceramic body according to the present invention. When various kinds of the passive members are integrated into the non-sintered ceramic body, the degree of integration of the patterns constituting the passive members may be different between one major surface side and the other major surface side of the non-sintered ceramic body to arise a different degree of contraction by firing between the two major surfaces, thereby making the substrate to be readily deformed. Deformation of the substrate such as warp and distortion may be well suppressed, on the contrary, by allowing the first constraint layer having a higher rigidity than the rigidity of the second constraint layer to adhere on one major surface side that may be largely contracted by firing.

Capacitors and inductors may be incorporated into the non-sintered ceramic body as block members. However, warp and distortion may be caused by the difference of the degree of contraction between one major surface side and the other major surface side ascribed to the difference between the contraction behavior of dielectric materials or magnetic materials constituting respective block members, and the contraction behavior of the non-sintered ceramic body (particularly the difference of the contraction onset temperature and shrinkage ratio), when the capacitor and inductor are formed into non-sintered blocks to integrate them into the prescribed locations in the non-sintered ceramic body. Warp and distortion of the substrate can be well suppressed, on the contrary, when the first constraint layer having a higher rigidity than the rigidity of the second constraint layer is adhered on one major surface side that may be largely contracted by firing the non-sintered ceramic body. The passive members to be integrated in the present invention are not necessarily restricted to elementary members such as the capacitors and inductors, but a composite of them, for example a LC composite member in which the capacitors and inductors are combined, may be available. Although the block member is desirably a non-sintered block, a block member (a chip member) after firing may be used.

The non-sintered ceramic body is desirably fired at a temperature of 1000° C. or below. It is also desirable to constitute the non-sintered ceramic body with a ceramic material known in the art such as a crystalline glass based, a composite glass based or a non-glass based material that is sintered at a low temperature. When the non-sintered ceramic body is constructed with the material as described above, a low melting point metallic material such as Ag, Ag—Pd, Ag—Pt, Cu and Au may be used for the conductor pattern to serve as electrodes and wiring, thereby enabling to comply with the requirements of making the signals high speed and high frequency. However, the materials for the conductor pattern are not limited to those as described above, but other metallic materials such as Ni, Pt, Pd, W and Mo may be used.

The non-sintered ceramic body may be provided with such characteristics as insulation property, dielectric property and magnetic property. The material may desirably contain a glass component with a softening temperature of 800° C. or below, and it is advantageous for allowing the constraint force of the constraint layer to be fully exhibited that the content of the glass component (a filler component) is selected to be within a range of 5 to 100 parts by weight. The non-sintered ceramic body desirably contains a liquid phase forming material such as, for example, lead oxide and bismuth oxide that forms a liquid phase at a temperature of 900° C. or below. The content of the liquid phase forming material is advantageously selected to be within a range of 5 to 100 parts by weight relative to the ceramic component.

The non-sintered ceramic body according to the present invention may be fired without applying any load. A ceramic multilayer substrate having an excellent dimensional accuracy and few distortion of the substrate can be readily and efficiently manufactured without providing a special equipment for firing under a load. A ceramic multilayer substrate having good surface smoothness may be also obtained without forming any fine roughness caused by the porous plate on the surface of the ceramic substrate obtained.

However, the present invention is not necessarily restricted to the method without applying any load during firing, but the non-sintered ceramic body may be fired under a given load. For example, the non-sintered ceramic body is subjected to a firing treatment while applying a uniaxial load of 10 kg/cm$^2$ or less against the non-sintered ceramic body provided with the constraint layers.

The method for manufacturing the ceramic substrate according to the present invention will be described hereinafter with reference to the embodiments.

First Embodiment

The method for manufacturing the ceramic multilayer substrate according to the first embodiment will be described with reference to FIGS. 1 to 5.

A non-sintered molded block to serve as a capacitor C and a non-sintered molded block to serve as an inductor L are prepared as shown in FIG. 1. The molded block for the capacitor C comprises a multilayer structure in which inner electrodes are laminated via a dielectric ceramic green sheet mainly composed of a dielectric ceramic powder. Terminal electrodes are formed on both opposite sides faces of the molded block, respectively, and the inner electrodes to be connected to one terminal electrode and the inner electrodes to be connected to the other terminal electrode are alternately laminated as seen in conventional multilayer ceramic capacitors.

The molded block for the inductor L comprises, on the other hand, a multilayer structure in which the inner electrodes are laminated via a magnetic ceramic green sheet mainly composed of a magnetic ceramic powder. Terminal electrodes are formed on both opposite end faces of the molded block, and respective inner electrodes are connected with via-holes perforating through the magnetic ceramic green sheet to totally form a conductor pattern elongating as a coil.

The molded block for the capacitor C and the molded block for the inductor L are constructed so as to be able to be fired at a temperature of 1000° C. or below. Ceramic functional materials as principal components of the dielectric ceramic green sheet and the magnetic ceramic green sheet, or materials prepared by adding a glass into the dielectric ceramic material and the magnetic ceramic material, or a crystalline glass itself, is used for the purpose as described above.

A ceramic slurry prepared by dispersing a mixed powder, in which a small amount of a borosilicate glass is mixed into barium titanate, into an organic vehicle is formed into a sheet by a doctor blade method for use in the dielectric ceramic green sheet that is practically used. Similarly, a ceramic slurry prepared by dispersing a mixed powder, in which a small amount of a borosilicate glass is mixed into nickel zinc ferrite, into an organic vehicle is formed into a sheet by a doctor blade method for use in the magnetic ceramic green sheet that is practically used. In addition, the inner electrodes and terminal electrodes and constituting the capacitor C, and the inner electrodes, terminal electrodes and via-holes constituting the inductor L may be formed, for example, using a conductor paste containing a metal or an alloy such as Ag, Ag—Pt, Ag—Pd, Cu or Au.

The molded block for the capacitor C, and the molded block for the inductor L are desirably formed by a press-bonding process after laminating a given number of the dielectric ceramic green sheets in which the inner electrodes are formed, and a give number of ceramic green sheets in which the inner electrodes and via-holes are formed, respectively. A pressure of about 200 kg/cm$^2$ is suitable for press-bonding.

For forming the laminated body 4 shown in FIG. 1, on the other hand, insulation ceramic green sheets 1*c*, 1*d*, 1*e* and 1*f* are prepared. A ceramic slurry prepared by dispersing a mixed powder, in which a glass powder is mixed with an insulation ceramic powder, is formed into a sheet by a doctor blade method for preparing each of the insulation ceramic green sheet 1c, 1d, 1e and 1f. The laminated body 4 also comprises a laminated body in which the ceramic green sheets 1c, 1d, 1e and 1f formed to provide a via-hole 2f and spaces 3a and 3b are sequentially laminated.

The bolded block for the capacitor C and the molded block for the inductor L are inserted into the spaces 3a and 3b of the laminated body 4 as shown in FIG. 1. Each terminal electrode of the individual molded block is accordingly exposed from the open face of the spaces 3a and 3b. The blocks are then press-bonded with a hydraulic press at a pressure of about 500 kg/cm$^2$ to form the laminated body 4 in which the molded block for the capacitor C and the molded block for the inductor L are integrated. Adhesion among the ceramic green sheets 1c, 1d, 1e and 1f containing the molded block for the capacitor C and the molded block for the inductor L can be enhanced by subjecting the laminated body 4 to the press-bonding process, while each molded block is tightly adhered to the inner circumference wall of the space.

Figure 2:
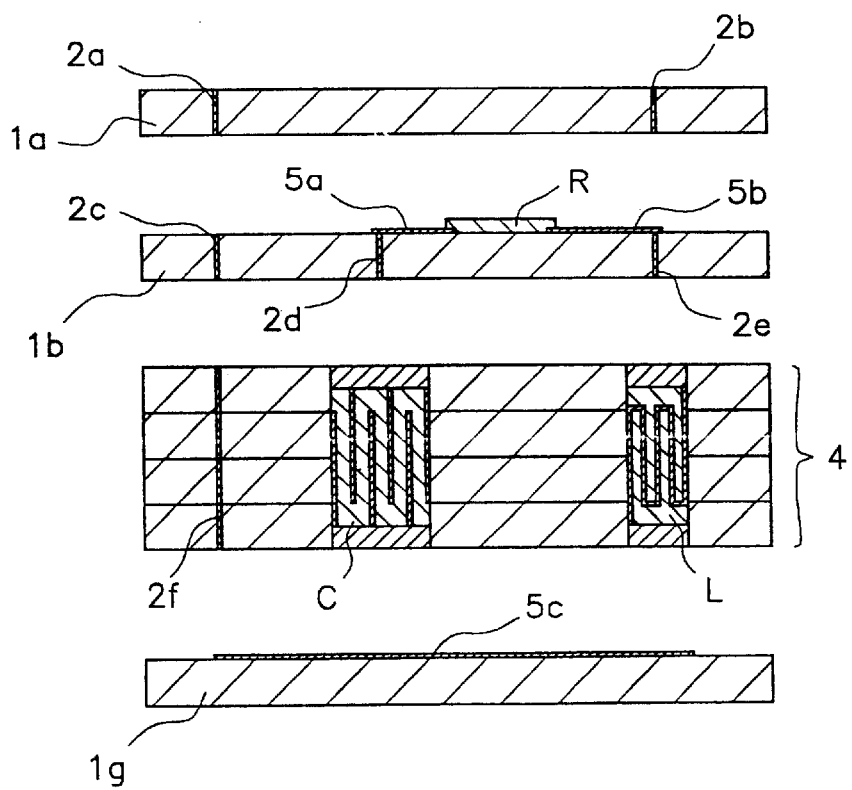
FIG. 2 shows an illustrative cross section for constructing the multilayer ceramic body by laminating ceramic green sheets on and under the laminated body in the manufacturing process of the ceramic multilayer substrate as described above.

Then, insulation ceramic green sheets 1a and 1b are laminated on the upper face of the laminated body 4 in which the molded block for the capacitor C and the molded block for the inductor L are integrated as shown in FIG. 2, followed by laminating and press-bonding an insulation ceramic green sheet 1g on the lower face side of the laminated body. A non-sintered multilayer ceramic body 1 is formed by the process described above.

The via-holes 2a and 2b are formed on the insulation ceramic green sheet 1a, while the via-hole 2c, inner. conductor patterns 5a and 5b, and a thick-film resistor R are formed on the insulation ceramic green sheet 1b. The via-holes 2a is formed so as to be in electrical continuity with the via-holes 2c and 2f, while the via-hole 2b is formed so as to be in electrical continuity with the inner conductor pattern 5b. One end of the thick-film resistor R is put into electrical continuity with one of the terminal electrode of the capacitor C via the inner conductor pattern 5a and the via-hole 2d, while the other end of the thick-film resistor R is put into electrical continuity with one terminal electrode of the inductor L via the inner conductor pattern 5b and the via-hole 2e. An inner conductor pattern 5c is formed on the insulation ceramic green sheet 1g, and the inner conductor pattern 5c is put into electrical continuity with the via-hole 2f, the other terminal electrode of the capacitor C and the other terminal electrode of the inductor L.

The ceramic green sheet 1a, 1b and 1g are prepared by forming a ceramic slurry, in which a mixed powder of an insulation ceramic and a glass is dispersed into an organic vehicle, into a sheet by a doctor blade method as described above. The inner conductor patterns 5a, 5b and 5c, and the via-holes 2a, 2b, 2c, 2d and 2e may be formed using a conductor paste containing, for example, Ag, Ag—Pt, Ag—Pd, Cu, Ni, Pt, Pd, W, Mo and Au, and can be printed to be desired patterns by a screen printing. The thick film resistor R is also formed by a screen printing of the conductor paste, wherein a paste prepared by dispersing a mixed powder of ruthenium oxide and a small amount of borosilicate glass into an organic vehicle may be used.

The insulation ceramic powder used as a principal component of the insulation ceramic green sheets 1a, 1b, 1c, 1d, 1e, 1f and 1g is able to fire at a temperature of 1000° C. or below. For example, the insulation ceramic powder capable of firing at a relatively low temperature of 1000° C. or below may be obtained when the insulation ceramic powder contains a glass powder with a softening point of 800° C. or below, or a liquid phase forming material that forms a liquid phase at 900° C. or below, and when the content of the glass powder or the liquid phase forming material is selected to be within a range of 5 to 100 parts by weight relative to 100 parts by weight of the ceramic powder. When the content of the glass powder or the liquid phase forming material is less than 5 parts by weight, the firing temperature tends to be higher than 1000 ° C. It is not preferable that the firing temperature is high because the selection range of the foregoing materials turns out to be narrow. Practically available ceramic green sheet is obtained by molding a ceramic slurry, prepared by dispersing a mixed powder of borosilicate glass and alumina into an organic vehicle, into a sheet by a doctor blade method. Such insulation ceramic green sheet can be fired at a relatively low temperature of 800 to 1000° C.

Figure 3:
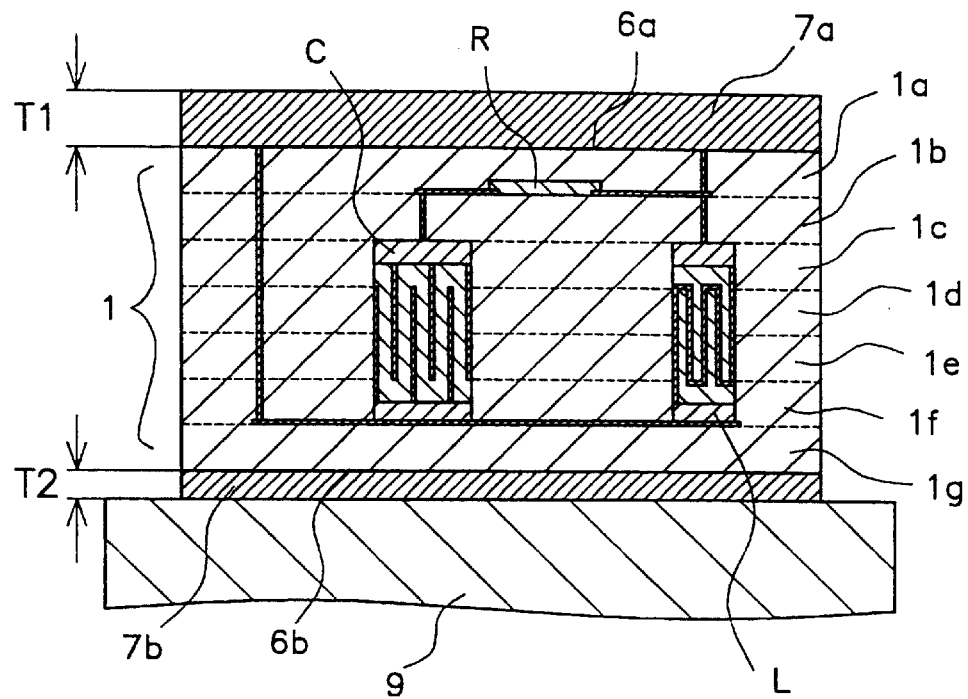
FIG. 3 shows an illustrative cross section with the constraint layers when the constraint layers are adhered on, the upper and lower major surfaces of the multilayer ceramic body in the manufacturing process of the ceramic multilayer substrate as described above.
Figure 4:
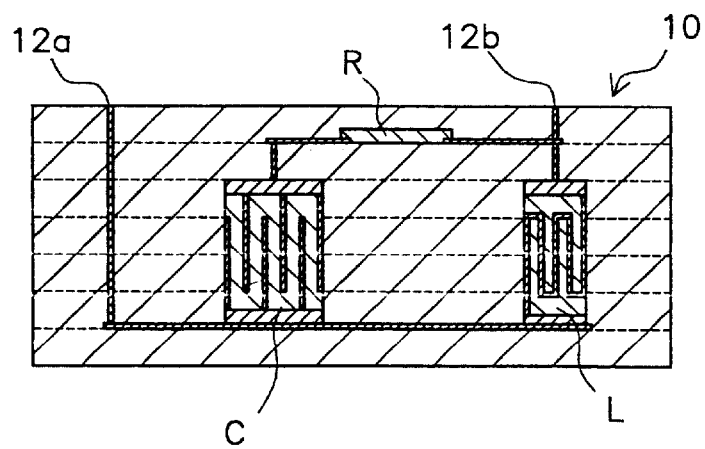
FIG. 4 shows an illustrative cross section of the ceramic multilayer substrate after peeling and removing the constraint layers in the manufacturing process of the ceramic multilayer substrate as described above.

A multilayer ceramic body with constraint layers is formed by adhering a first constraint layer 7a and a second constraint layer 7b on one major surface 6a and the other major surface 6b, respectively, of the multilayer ceramic body 1 formed by sequentially laminating and press-bonding the insulation ceramic green sheet 1a, the insulation ceramic green sheet 1b, the laminated body 4 and the ceramic green sheet 1g as shown in FIG. 3. The multilayer ceramic body with constraint layers is mounted on a setter 9 and placed in a firing equipment.

The first constraint layer 7a and the second constraint layer 7b comprise the sheets of constraint layers prepared by dispersing a non-sintered ceramic powder, which is not sintered under the firing condition of the multilayer ceramic body 1, into an organic binder. Since all of the molded block for the capacitor C and the molded block for the inductor L, and the insulation ceramic green sheets 1a, 1b, 1c, 1d, 1e, 1f and 1g are able to be fired at a temperature of 1000° C. or below, the multilayer ceramic body 1 as a composite of these members is also possible to be fired at a temperature of 1000° C. or below. In other words, the constraint layers 7a and 7b may be constituted with the ceramic powder that is not sintered at a temperature of 1000° C. or below.

The constraint layers 7a and the constraint layer 7b are provided to be adhered on respective manor surfaces located at both ends along the direction of lamination of the multilayer ceramic body 1, or on one major surface 6a and the other major surface 6b, respectively. The constraint layers are press-bonded thereafter together with the multilayer ceramic body 1. A hydraulic press at a pressure of about 1000 kg/cm$^2$ is favorably used for press-bonding.

The first constraint layer 7a has a thickness of T1 and the second constraint layer 7b has a thickness of T2. The multilayer ceramic body 1 shows concave warp toward one major surface 6a side when one major surface 6a of the multilayer ceramic body 1 is more largely contracted than the other constraint layer 6b is, or when the first constraint layer and the second constraint layer have the same thickness one another and their rigidity is insufficient. Accordingly, the first constraint layer 7a is formed to have a larger thickness T1 than the thickness T2 of the second constraint layer 7b. In other words, the rigidity of the first constraint layer 7a becomes higher than the rigidity of the second constraint layer 7b when the relation of T1>T2 is valid.

It is desirable that the thickness T1 of the first constraint layer 7a is three times or less as large as the thickness T2 of the second constraint layer 7b as hitherto described. However, since the thicknesses T1 and T2 are variable depend on the material and number of sheets of the ceramic layer, and the material of the conductor pattern, the degree of integration and the number of the layers of the conductor pattern, in addition to the degree of integration of wiring pattern and constituting members of the multilayer ceramic body, the thickness may be appropriately selected.

Subsequently, the molded block for the capacitor C and the molded block of the inductor L are fired at a temperature of about 900° C. in the air without applying any load to sinter the molded block for the capacitor C and the molded block for the inductor L into the sintered capacitor C and sintered inductor L, respectively, besides sintering the insulation ceramic green sheets 1a, 1b, 1c, 1d, 1e, 1f and 1g, thereby obtaining the ceramic multilayer substrate 10 as a sintered body of the multilayer ceramic body 1.

After cooling these members, the first constraint.layer 7a and the second constraint layer 7b are removed. Since each constraint layer remains to be a porous layer comprising the non-sintered ceramic powder, it can be peeled and removed by various methods such as wet horning method and sand blast method. While a reaction phase may be formed at the interface between each constraint layer and the, ceramic multilayer substrate (or the interface between the constraint layer and the surface conductor layer), the reaction layer may be removed by the foregoing wet horning method and sand blast method, or may be left behind provided that it does not affect the characteristics of the ceramic multilayer substrate 10.

Figure 5:
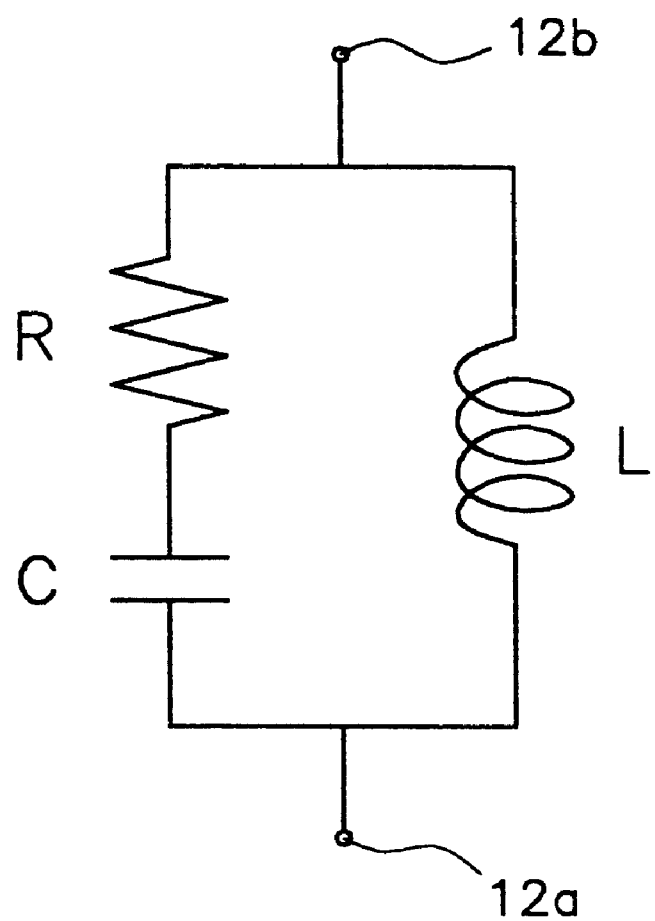
FIG. 5 shows an equivalent circuit diagram of the ceramic multilayer substrate as described above.

The capacitor C, the inductor L and the thick-film resistor R as passive members are integrated into the ceramic multilayer substrate 10 obtained by the method as described above as shown in FIG. 4. An inner conductor pattern using the capacitor C, the inductor L and the thick film resistor R as circuit elements, and via-holes are also formed in the ceramic multilayer substrate 10. The ceramic multilayer substrate 10 comprising the circuit construction as shown in FIG. 5 is formed by providing external terminals 12a and 12b on one major surface of the ceramic multilayer substrate.

According to the method for manufacturing the ceramic multilayer substrate in this embodiment, the first constraint layer 7a and the second constraint layer 7b that are not sintered under the sintering condition of the multilayer ceramic body 1 are adhered on the one major surface 6a and the other major surface 6b, respectively, of the multilayer ceramic body 1, wherein the first constraint layer 7a is made to be a constraint layer having a higher rigidity than the rigidity of the second constraint layer 7b, and the first constraint layer 7a is adhered on the one major surface 6a side that is largely contracted by firing. As a result, warp of the substrate that may caused by the difference of the degree of contraction between the one major surface 6a side and the other major surface 6b side can be minimized. Since contraction by firing along the directions on the substrate plane may be also suppressed, the ceramic multilayer substrate 10 having an excellent dimensional accuracy is obtainable. In addition, since the firing treatment is carried out without applying any load, no special equipments are used thereby to readily and efficiently manufacture the ceramic multilayer substrate 10.

The optimum thickness of the first constraint layer 7a and the second constraint layer 7b in the embodiment shown in FIGS. 1 to 5 will be described below.

The case when the first constraint layer 7a has the same thickness as the thickness of the second constraint layer 7b, or when the ratio between the thickness T1 of the first constraint layer 7a and the thickness T2 of the second constraint layer 7b is 1.0 while maintaining the rigidity of both layers to be equal, will be described first. The thickness of each constraint layer was changed within a range of 0.05 mm to 2.0 mm, and the shrinkage ratio, dimensional irregularity, and the degree of warp of the ceramic multilayer substrate 10 were measured. The results of measurements are shown in TABLE 1 below, in which the thickness of the multilayer ceramic body is fixed to 1 mm. The cells in the table where no measured data are filled means that the measurement was impossible due to large degree of warp (the same hereinafter).

TABLE 1

| EXAMPLE | THICKNESS OF FIRST CONSTRAINT LAYER (mm) | THICKNESS OF SECOND CONSTRAINT LAYER (mm) | RATIO OF THICKNESS | SHRINKAGE RATIO (%) | DIMENSIONAL DISTRIBUTION (%) | DEGREE OF WARP ($\mu$m/INCH$^2$) |
|---|---|---|---|---|---|---|
| 1 | 2.0 | 2.0 | 1.0 | 0.10 | 0.10 | 20 |
| 2 | 1.6 | 1.6 | 1.0 | 0.10 | 0.10 | 20 |
| 3 | 1.4 | 1.4 | 1.0 | 0.10 | 0.10 | 30 |
| 4 | 1.2 | 1.2 | 1.0 | 0.10 | 0.10 | 35 |
| 5 | 1.0 | 1.0 | 1.0 | 0.10 | 0.10 | 40 |
| 6 | 0.8 | 0.8 | 1.0 | 0.10 | 0.10 | 45 |
| 7 | 0.6 | 0.6 | 1.0 | 0.10 | 0.10 | 50 |
| 8 | 0.5 | 0.5 | 1.0 | 0.10 | 0.10 | 60 |
| 9 | 0.4 | 0.4 | 1.0 | 0.12 | 0.12 | 120 |
| 10 | 0.3 | 0.3 | 1.0 | 0.15 | 0.18 | 150 |
| 11 | 0.2 | 0.2 | 1.0 | 0.56 | 0.23 | 180 |
| 12 | 0.1 | 0.1 | 1.0 | 3.55 | 0.25 | 300 |
| 13 | 0.05 | 0.05 | 1.0 | — | — | 2000 |

TABLE 1 shows that a ceramic multilayer substrate in which irregularity in the shrinkage ratio and dimensional accuracy is suppressed and having small degree of warp besides being excellent in dimensional accuracy can be obtained at a thickness of each constraint layer of 1.4 mm or more, when the thickness T1 of the first constraint layer 7a is equal to the thickness T2 of the second constraint layer 7b. However, the degree of warp as well as irregularity of the shrinkage ratio and dimensional accuracy tend to increase as the thickness of each constraint layer is reduced. Accordingly, although a thickness of each constraint layer of 0.5 mm or more is sufficient for sufficiently reducing the dimensional irregularity of the ceramic multilayer substrate, a thickness of each constraint layer of 1.6 mm or more is additionally needed in order to sufficiently suppress the degree of warp of the substrate.

The case when the thickness T1 of the first constraint layer 7a is different from the thickness T2 of the second constraint layer 7b, or when the thickness T1 of the first constraint layer 7a is larger than the thickness T2 of the second constraint layer 7b to allow the first constraint layer 7a to serve as a constraint layer having a higher rigidity, and the first constraint layer 7a is adhered on one major surface 6a side that is more largely contracted by firing, will be then described. The shrinkage ratio, dimensional irregularity and the degree of warp of the ceramic multilayer substrate 10 were determined. The results of measurements are shown in TABLE 2 below. The thickness of the multilayer ceramic body 1 was adjusted to 1 mm as in the cases described above.

the degree of warp of the substrate be minimized within an area where the ratio between the first constraint layer and the second constraint layer exceeds three, but the constraint layer is peeled off from the substrate due to deformation of the constraint layer accompanied by the warp of the substrate.

The cost required for the constraint layer is depressed besides enabling the constraint layer to be quite easily peeled and removed, by allowing the thickness of the constraint layer required for applying the non-contraction process to be minimized, thereby largely improving the manufacturing efficiency of the ceramic multilayer substrate. Restricting the thickness of each constraint layer within a minimal essential thickness allows the organic binder in the multilayer ceramic body, and the organic binder in the constraint layer, to be smoothly volatilized

TABLE 2

| EXAMPLE | THICKNESS OF FIRST CONSTRAINT LAYER (mm) | THICKNESS OF SECOND CONSTRAINT LAYER (mm) | RATIO OF THICKNESS | SHRINKAGE RATIO (%) | DIMENSIONAL DISTRIBUTION (%) | DEGREE OF WARP ($\mu$m/INCH$^2$) |
|---|---|---|---|---|---|---|
| 14 | 0.80 | 0.80 | 1.0 | 0.10 | 0.10 | 45 |
| 15 | 0.80 | 0.72 | 1.1 | 0.10 | 0.10 | 35 |
| 16 | 0.80 | 0.67 | 1.2 | 0.10 | 0.10 | 26 |
| 17 | 0.80 | 0.62 | 1.3 | 0.10 | 0.10 | 22 |
| 18 | 0.80 | 0.57 | 1.4 | 0.10 | 0.10 | 20 |
| 19 | 0.80 | 0.53 | 1.5 | 0.10 | 0.10 | 20 |
| 20 | 0.80 | 0.50 | 1.6 | 0.10 | 0.10 | 25 |
| 21 | 0.80 | 0.47 | 1.7 | 0.10 | 0.10 | 55 |
| 22 | 0.80 | 0.44 | 1.8 | 0.10 | 0.10 | 70 |
| 23 | 0.80 | 0.42 | 1.9 | 0.10 | 0.10 | 120 |
| 24 | 0.80 | 0.40 | 2.0 | 0.11 | 0.10 | 150 |
| 25 | 0.70 | 0.50 | 1.4 | 0.10 | 0.10 | 20 |
| 26 | 0.60 | 0.43 | 1.4 | 0.10 | 0.10 | 20 |
| 27 | 0.50 | 0.36 | 1.4 | 0.12 | 0.10 | 22 |

TABLE 2 shows that the shrinkage ratio and dimensional irregularity as well as the degree of warp of the substrate can be suppressed by adjusting the thickness T1 of the first constraint layer 7a and the thickness T2 of the second constraint layer 7b to be in an optimum ratio, when the thickness T1 of the first constraint layer 7a is made to be larger than the thickness T2 of the second constraint layer 7b, and when the first constraint layer 7a is adhered on one major surface 6a side that is more largely contracted by firing. The shrinkage ratio and dimensional irregularity as well as the degree of warp of the substrate can be minimized, particularly when the ratio of the thickness T1 of the first constraint layer 7a against the thickness T2 of the second constraint layer is adjusted to about 1.1 to 1.6 even if the thickness T1 of the first constraint layer 7a is as thin as 0.5 to 0.8 mm.

A thickness T1 of the first constraint layer 7a and a thickness T2 of the second constraint layer 7b of 0.60 mm and 0.43 mm, respectively, are sufficient for suppressing the dimensional irregularity and the degree of warp of the substrate. In other wards, the required quantity of the constraint layer can be reduced to one third of the quantity of each constraint layer when the thickness is 1.6 mm or more. It was also revealed to be desirable that the thickness T1 of the first constraint layer 7a is three times or less as large as the thickness T2 of the second constraint layer 7b, since the effect of reducing the thickness of the constraint layer is seldom displayed even when the thickness T1 of the first constraint layer 7a exceeds three times or more of the thickness T2 of the second constraint layer 7b. Provided that during firing, which enables the firing time to be reduced and a high quality of ceramic multilayer substrate containing less firing irregularity to be obtained.

Since the ceramic green sheet does not substantially show any contraction along the directions on the X-Y plane, it is made easy to make respective contraction behaviors of the molded blocks and ceramic green sheets to be matched one another when various kinds of the molded blocks and the, ceramic green sheets are simultaneously fired. Accordingly, the selection range of the materials of the molded blocks and the ceramic green sheets can be further expanded.

Since block members such as the capacitor C and the inductor L are completely buried into the laminated body, environment resistance such as moisture resistance of these passive members are improved. The selection range of the commercial design considering the specification and cost of the product may be expanded and cross-talk of signals may be avoided, because not only two-dimensional arrangement but also three-dimensional arrangement of these block members is possible.

Since the integrated non-sintered molded blocks can be fired together with the non-sintered multilayer ceramic body, contraction behaviors of them during firing should not be so strictly controlled as compared with the case when the multilayer ceramic body is fired together with the buried and previously fired block members, thereby enabling to expand the selection range of the materials for the ceramic green sheets and molded blocks.

The ceramic multilayer substrate can maintain better planarity than the ceramic multilayer substrate in which passive members are constructed by a lamination method does, because spaces for inserting the molded blocks to serve as passive members have been previously provided in the non-sintered multilayer ceramic body. Consequently, highly integrated wiring is made possible with high dimensional accuracy while eliminating its characteristics to be irregular, since deformation and breakage of wiring conductors are hardly caused. The number of the ceramic layers provided in the ceramic multilayer substrate is readily increased or decreased to consequently make it easy for the ceramic multilayer substrate to have high performance.

The multilayer structure of the molded block to serve as a passive member allows a large capacitance capacitor to be obtained when the passive member is a capacitor, or a high inductance inductor to be obtained when the passive member is an inductor.

While the multilayer ceramic body is fired without applying any load in this embodiment, it is also effective to optionally apply a load in order to further reduce the degree of warp of the substrate. A quite low load of 50 g/cm$^2$ is sufficient for obtaining a sufficient effect. The capacitor, the inductor and the thick-film resistor according to this embodiment have been confirmed to exhibit the characteristics as designed.

Second Embodiment

The method for manufacturing the ceramic multilayer substrate according to the second embodiment will be described hereinafter with reference to FIGS. 6 to 8.

Figure 6:
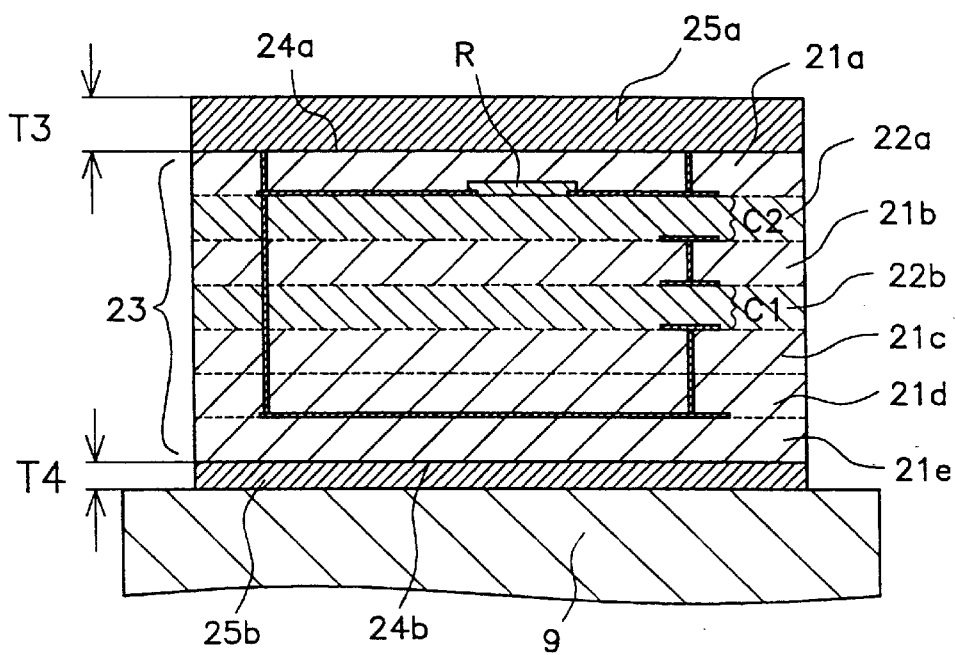
FIG. 6 shows an illustrative cross section of the multilayer ceramic body with the constraint layers when the constraint layers are adhered on the upper and lower major surfaces of the multilayer ceramic body in the manufacturing process of the ceramic multilayer substrate according to the second embodiment.
Figure 7:
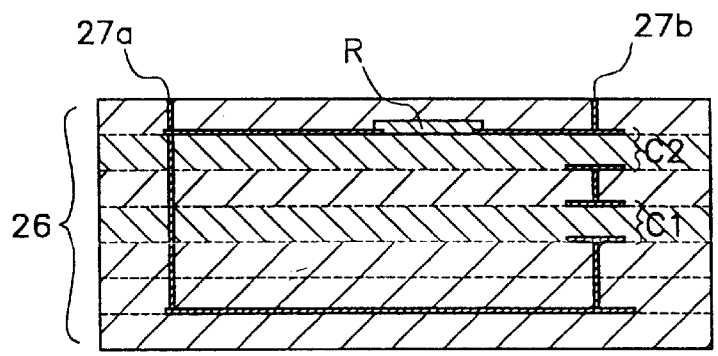
FIG. 7 shows an illustrative cross section of the ceramic multilayer substrate after peeling and removing the constraint layers in the manufacturing process of the ceramic multilayer substrate as described above.

A multilayer ceramic body 23 is prepared as shown in FIG. 6, in which insulation ceramic green sheets 21a, 21b, 21c, 21d and 21e, and dielectric ceramic green sheets 22a and 22b are laminated. A multilayer ceramic body with constraint layers is also prepared, in which a first constraint layer 25a is adhered on one major surface 24a of the multilayer ceramic body 23, and a second constraint layer 25b is adhered on the other major surface 24b of the multilayer ceramic body 23. The multilayer ceramic body is mounted on a setter 9 to place it in a firing equipment.

A capacitor C1, a capacitor C2 and a thick-film resistor R are formed within the multilayer ceramic body 23, and a prescribed circuit is constructed with via-holes and inner layer conductor patterns. Each capacitor is formed by laminating ceramic green sheets on which a desired conductor pattern has been formed, and dielectric ceramic green sheets 22a and 22b having a high dielectric constant are provided between one electrode and the other electrode constituting each capacitor, thereby forming the large capacitance capacitors C1 and C2.

The first constraint layer 25a has a thickness T3 while the second constraint layer has a thickness T4. Since one major surface 24a side of the multilayer ceramic-body 23 has a larger shrinkage ratio than the other major surface 24b side in this embodiment, the first constraint layer 25a is formed to have a larger thickness T3 than the thickness T4 of the second constraint layer 25b. That is, rigidity of the first constraint layer 25a turns out to be higher than the rigidity of the second constraint layer 25b when the relation of T3>T4 is valid.

After firing the multilayer ceramic body as shown in FIG. 6 at about 900° C. in the air without applying any load, the first constraint layer 25a and the second constraint layer 25b are removed. Then, a ceramic multilayer substrate 26 comprising external electrodes 27a and 27b on one major surface and integrating the capacitors C1 and C2, and the thick-film resistor R is obtained as shown in FIG. 7. The ceramic multilayer substrate 26 comprises a circuit construction as shown in FIG. 8.

According to the method for manufacturing the ceramic multilayer substrate of this embodiment, the first constraint layer 25a and the second constraint layer 25b, which are prepared by dispersing an inorganic oxide powder that is not sintered under the sintering condition of the multilayer ceramic body 23 in an organic binder, are adhered, respectively, on one major surface 24a and the other major surface 24b of the multilayer ceramic body 23, wherein the first constraint layer 25a is made to be a layer having a higher rigidity than that of the second constraint layer 25b and wherein the first constraint layer 25a is adhered on one major surface 24a side that may be largely contracted by firing. Consequently, the degree of warp of the substrate that may caused by the difference of the shrinkage ratio between one major surface 24a side and the other major surface 24b side of the multilayer ceramic body 23 can be minimized. A ceramic multilayer substrate 26 having an excellent dimensional accuracy can be also obtained by. suppressing firing contraction along the directions on the substrate plane. Moreover, the ceramic multilayer substrate as described above can be easily and efficiently obtained without using any special firing equipment, because the ceramic multilayer substrate is fired without applying any load.

An optimum thickness of the first constraint layer 25a and the second constraint layer 25b in the embodiment shown in FIGS. 6 to 8 will be described below.

First, the first constraint layer 25a has the same thickness as that of the second constraint layer 25b, or the ratio between the thickness T3 of the first constraint layer 25a and the thickness T4 of the second constraint layer 25b is 1.0 to make rigidity of both layers to be equal. The thickness of each constraint layer was changed in a range of 0.05 mm to 2.0 mm in this example, and the shrinkage ratio, dimensional irregularity and the degree of warp of the ceramic multilayer substrate 26 obtained by the foregoing manufacturing method were determined. The results of measurements are shown in TABLE 3. The thickness of the multilayer ceramic body was adjusted to 1 mm in these examples.

TABLE 3

| EXAMPLE | THICKNESS OF FIRST CONSTRAINT LAYER (mm) | THICKNESS OF SECOND CONSTRAINT LAYER (mm) | RATIO OF THICKNESS | SHRINKAGE RATIO (%) | DIMENSIONAL DISTRIBUTION (%) | DEGREE OF WARP ($\mu$m/INCH$^2$) |
|---|---|---|---|---|---|---|
| 28 | 2.0 | 2.0 | 1.0 | 0.10 | 0.10 | 15 |
| 29 | 1.6 | 1.6 | 1.0 | 0.10 | 0.10 | 15 |
| 30 | 1.4 | 1.4 | 1.0 | 0.10 | 0.10 | 15 |
| 31 | 1.2 | 1.2 | 1.0 | 0.10 | 0.10 | 23 |
| 32 | 1.0 | 1.0 | 1.0 | 0.10 | 0.10 | 40 |

TABLE 3-continued

| EXAMPLE | THICKNESS OF FIRST CONSTRAINT LAYER (mm) | THICKNESS OF SECOND CONSTRAINT LAYER (mm) | RATIO OF THICKNESS | SHRINKAGE RATIO (%) | DIMENSIONAL DISTRIBUTION (%) | DEGREE OF WARP ($\mu$m/INCH$^2$) |
|---|---|---|---|---|---|---|
| 33 | 0.8 | 0.8 | 1.0 | 0.10 | 0.10 | 46 |
| 34 | 0.6 | 0.6 | 1.0 | 0.10 | 0.10 | 55 |
| 35 | 0.5 | 0.5 | 1.0 | 0.10 | 0.10 | 70 |
| 36 | 0.4 | 0.4 | 1.0 | 0.12 | 0.12 | 120 |
| 37 | 0.3 | 0.3 | 1.0 | 0.15 | 0.18 | 150 |
| 38 | 0.2 | 0.2 | 1.0 | 0.56 | 0.23 | 200 |
| 39 | 0.1 | 0.1 | 1.0 | 3.55 | 0.25 | 350 |
| 40 | 0.05 | 0.05 | 1.0 | — | — | 2000 |

TABLE 3 shows that a ceramic multilayer substrate in which irregularity of the shrinkage ratio and dimensional irregularity are suppressed while having less degree of warp and excellent dimensional accuracy can be obtained at a thickness of each constraint layer of 1.2 mm or more, when the thickness T3 of the first constraint layer 25a is adjusted to be the same as the thickness of T4 of the second constraint layer 25b. However, the degree of warp of the substrate as well as the irregularity of the shrinkage ratio and dimensional irregularity showed tendencies to increase as the thickness of each constraint layer is reduced. Although a thickness of 0.5 mm or more of each constraint layer relative to the thickness of 1 mm of the non-sintered multilayer ceramic body 23 is sufficient for sufficiently reducing the dimensional irregularity of the ceramic multilayer substrate, a thickness of 1.4 mm or more of each constraint layer is additionally required for more sufficiently reduce the degree of warp of the substrate.

The case when the thickness T3 of the first constraint layer 25a is made to be different from the thickness T4 of the second constraint layer 25b, or when the thickness T3 of the first constraint layer 25a is made to be larger than the thickness T4 of the second constraint layer 25b to allow the first constraint layer 25a to serve as a constraint layer having a higher rigidity, and the first constraint layer 25a is adhered on one major surface 24a side that may be largely contracted by firing, will be then described. The shrinkage ratio, dimensional irregularity and the degree of warp of the ceramic multilayer substrate 26 obtained were determined. the results of measurements are shown in TABLE 4.

TABLE 4 shows that irregularities of the shrinkage ratio and dimension as well as the degree of warp may be suppressed by appropriately adjusting the ratio between the thickness T3 of the first constraint layer 25a and the thickness T4 of the second constraint layer 25b, when the thickness T3 of the first constraint layer 25a is adjusted to be larger than the thickness of T4 of the second constraint layer 25b, and the first constraint layer 25a is adhered on one major surface 24a side having a larger shrinkage ration by firing. It can be also understood that irregularities of the contraction ratio and dimension as well as the degree of warp may be minimized by adjusting the ratio between the thickness T3 of the first constraint layer 25a and the thickness of T4 of the second constraint layer 25b to about 1.1 to 1.6, even when the thickness T3 of the first constraint layer 25a is as thin as about 0.5 mm to 0.8 mm.

When the thickness T3 of the first constraint layer 25a and the thickness of T4 of the second constraint layer 25b is 0.60 mm and 0.43 mm, respectively, the dimensional irregularity as well as the degree of warp of the substrate can be sufficiently reduced, thereby enabling the required quantity of the constraint layer to be one third as small as that of each constraint layer having a thickness of 1.4 mm or more.

The cost required for the constraint layer is depressed besides enabling the constraint layer to be quite easily peeled and removed by minimizing the thickness of the constraint layer, thereby largely improving the manufacturing efficiency of the ceramic multilayer substrate. When the thickness of each constraint layer is restricted within a minimum essential range, the organic binder in the multi-

TABLE 4

| EXAMPLE | THICKNESS OF FIRST CONSTRAINT LAYER (mm) | THICKNESS OF SECOND CONSTRAINT LAYER (mm) | RATIO OF THICKNESS | SHRINKAGE RATIO (%) | DIMENSIONAL DISTRIBUTION (%) | DEGREE OF WARP ($\mu$m/INCH$^2$) |
|---|---|---|---|---|---|---|
| 41 | 0.80 | 0.80 | 1.0 | 0.10 | 0.10 | 46 |
| 42 | 0.80 | 0.72 | 1.1 | 0.10 | 0.10 | 23 |
| 43 | 0.80 | 0.67 | 1.2 | 0.10 | 0.10 | 20 |
| 44 | 0.80 | 0.62 | 1.3 | 0.10 | 0.10 | 16 |
| 45 | 0.80 | 0.57 | 1.4 | 0.10 | 0.10 | 15 |
| 46 | 0.80 | 0.53 | 1.5 | 0.10 | 0.10 | 15 |
| 47 | 0.80 | 0.50 | 1.6 | 0.10 | 0.10 | 28 |
| 48 | 0.80 | 0.47 | 1.7 | 0.10 | 0.10 | 60 |
| 49 | 0.80 | 0.44 | 1.8 | 0.10 | 0.10 | 70 |
| 50 | 0.80 | 0.42 | 1.9 | 0.10 | 0.10 | 120 |
| 51 | 0.80 | 0.40 | 2.0 | 0.11 | 0.10 | 160 |
| 52 | 0.70 | 0.50 | 1.4 | 0.10 | 0.10 | 15 |
| 53 | 0.60 | 0.43 | 1.4 | 0.10 | 0.10 | 15 |
| 54 | 0.50 | 0.36 | 1.4 | 0.12 | 0.10 | 18 | layer ceramic body and in the constraint layer is smoothly volatilized during firing to enable the firing time to be shortened, thereby enabling a high quality ceramic multilayer substrate to be obtained with little firing irregularity.

Third Embodiment

The optimum mean particle size of the inorganic oxide powder in the first constraint layer and the second constraint layer will be described below.

The case when the mean particle size of the inorganic oxide powder in the first constraint layer 25a is made to be equal to the mean particle size of the inorganic oxide powder in the second constraint layer 25b, or when the rigidity of the first constraint layer 25a is made to be equal to the rigidity of the inorganic oxide powder in the second constraint layer 25b, will be described first. An alumina powder was used as the inorganic oxide powder herein, and the mean particle size (D50) of the alumina powder in each constraint layer was change within a range of 0.5 to 2.0 μm while changing the thickness of each constraint layer within a range of 0.5 to 1.8 mm. The shrinkage ratio, dimensional irregularity and the degree of warp of the ceramic multilayer substrate 26 manufactured by the same method as shown in the second embodiment were determined. The results of measurements are shown in TABLE 5. The thickness of the multilayer ceramic body was adjusted to 1 mm in these examples.

The effect of the mean particle size of the alumina powder in each constraint layer having a thickness of 0.5 mm will be then described. The shrinkage ratio, dimensional irregularity and the degree of warp may be well decreased when the mean particle size of the alumina powder in the first constraint layer 25a is made to be different from that in the second constraint layer 25b besides adjusting the mean particle size of the alumina powder in the first. constraint layer 25a to be smaller than that in the second constraint layer 25b as shown in the examples 76 to 69 in TABLE 5. It was also made clear that the thickness of the constraint layer required for sufficiently reducing the shrinkage ratio, dimensional irregularity and the degree of warp may be reduced to about one third as little as that described in the examples 55 to 60.

Fourth Embodiment

The optimum range of the organic binder in the first constraint layer and in the second constraint layer will be described below.

The case when the content of the organic binder in the first constraint layer 25a is adjusted to be equal to the content of

TABLE 5

| EXAMPLE | MEAN PARTICLE SIZE OF INORGANIC POWDER (μm) | | RATIO OF THICKNESS | SHRINKAGE RATIO (%) | DIMENSIONAL DISTRIBUTION (%) | DEGREE OF WARP (μm/INCH²) |
|---|---|---|---|---|---|---|
| | FIRST CONSTRAINT LAYER | SECOND CONSTRAINT LAYER | | | | |
| 55 | 2.0 | 2.0 | 1.8 | 0.10 | 0.10 | 15 |
| 56 | 1.0 | 1.0 | 1.8 | 0.10 | 0.10 | 15 |
| 57 | 0.5 | 0.5 | 1.8 | 0.10 | 0.10 | 15 |
| 58 | 2.0 | 2.0 | 1.4 | 0.10 | 0.10 | 15 |
| 59 | 1.0 | 1.0 | 1.4 | 0.10 | 0.10 | 15 |
| 60 | 0.5 | 0.5 | 1.4 | 0.10 | 0.10 | 15 |
| 61 | 2.0 | 2.0 | 1.0 | 0.10 | 0.10 | 40 |
| 62 | 1.0 | 1.0 | 1.0 | 0.11 | 0.10 | 25 |
| 63 | 0.5 | 0.5 | 1.0 | 0.14 | 0.11 | 20 |
| 64 | 2.0 | 2.0 | 0.5 | 0.10 | 0.10 | 70 |
| 65 | 1.0 | 1.0 | 0.5 | 0.12 | 0.10 | 60 |
| 66 | 0.5 | 0.5 | 0.5 | 0.18 | 0.12 | 50 |
| 67 | 0.5 | 2.0 | 0.5 | 0.10 | 0.10 | 15 |
| 68 | 0.5 | 1.0 | 0.5 | 0.11 | 0.10 | 30 |
| 69 | 1.0 | 2.0 | 0.5 | 0.10 | 0.10 | 40 |

The examples 55 to 66 in TABLE 5 show that the shrinkage ratio, dimensional irregularity and the degree of warp can be well reduced at a thickness of each constraint layer of 1.4 mm or more, irrespective of the mean particle size of the alumina powder. When the thickness of each constraint layer is as thin as 1.4 mm or less, on the contrary, the degree of warp of the substrate tends to be increased. Although the shrinkage ratio as well as irregularity of the shrinkage ratio have tendencies to decrease when the mean particle size of the alumina powder is decreased, the degree of warp of the substrate showed a tendency to increase. This is because the constraint layer itself causes a slight contraction when the mean particle size of the alumina powder to be used for the constraints layer is reduced, but rigidity of the constraint layer becomes high to hardly cause deformations such as warp.

the organic binder in the second constraint layer 25b, or when the first constraint layer 25a is made to have the same rigidity as that of,the second constraint layer 25b, fill be described first. A butyral based binder was used as the organic binder in these examples, and the content of the organic binder and the thickness of each constraint layer were changed within a range of 3 to 15 parts by weight relative to 100 parts by weight of the organic binder in each constraint layer, and within a range of 0.5 to 1.8 mm, respectively. The shrinkage ratio, dimensional irregularity and the degree of warp of the ceramic multilayer substrate 26 manufactured by the same method as in the second embodiment were determined, and the results of measurements are shown in TABLE 6. The thickness of the multilayer ceramic body was adjusted to be 1 mm in these examples.

TABLE 6

| EXAMPLE | CONTENT OF ORGANIC BINDER (PARTS BY WEIGHT) | | RATIO OF THICKNESS | SHRINKAGE RATIO (%) | DIMENSIONAL DISTRIBUTION (%) | DEGREE OF WARP ($\mu$m/INCH$^2$) |
|---|---|---|---|---|---|---|
| | FIRST CONSTRAINT LAYER | SECOND CONSTRAINT LAYER | | | | |
| 70 | 15 | 15 | 1.8 | 0.10 | 0.10 | 15 |
| 71 | 12 | 12 | 1.8 | 0.10 | 0.10 | 15 |
| 72 | 9 | 9 | 1.8 | 0.10 | 0.10 | 15 |
| 73 | 6 | 6 | 1.8 | 0.10 | 0.10 | 15 |
| 74 | 3 | 3 | 1.8 | 0.10 | 0.10 | 15 |
| 75 | 15 | 15 | 1.4 | 0.10 | 0.10 | 15 |
| 76 | 12 | 12 | 1.4 | 0.10 | 0.10 | 15 |
| 77 | 9 | 9 | 1.4 | 0.10 | 0.10 | 15 |
| 78 | 6 | 6 | 1.4 | 0.10 | 0.10 | 15 |
| 79 | 3 | 3 | 1.4 | 0.10 | 0.10 | 15 |
| 80 | 15 | 15 | 1.0 | 0.18 | 0.15 | 90 |
| 81 | 12 | 12 | 1.0 | 0.10 | 0.10 | 60 |
| 82 | 9 | 9 | 1.0 | 0.10 | 0.10 | 40 |
| 83 | 6 | 6 | 1.0 | 0.10 | 0.10 | 30 |
| 84 | 3 | 3 | 1.0 | 0.10 | 0.10 | 20 |
| 85 | 15 | 15 | 0.5 | 0.30 | 0.20 | 120 |
| 86 | 12 | 12 | 0.5 | 0.15 | 0.18 | 80 |
| 87 | 9 | 9 | 0.5 | 0.10 | 0.10 | 70 |
| 88 | 6 | 6 | 0.5 | 0.10 | 0.10 | 50 |
| 89 | 3 | 3 | 0.5 | 0.10 | 0.10 | 40 |
| 90 | 3 | 9 | 0.5 | 0.10 | 0.10 | 15 |
| 91 | 6 | 12 | 0.5 | 0.10 | 0.10 | 30 |
| 92 | 3 | 12 | 0.5 | 0.10 | 0.10 | 20 |

The examples 70 to 89 in TABLE 6 show that the shrinkage ratio, dimensional distribution and the degree of warp may be well decreased at a thickness of each constraint layer of 1.4 mm or more, irrespective of the content of the organic binder. However, the degree of warp of the substrate showed a tendency to increase when the thickness of each constraint layer is smaller than 1.4 mm. The shrinkage ratio, dimensional distribution and the degree of warp also showed a tendency to increase when the content of the organic binder is increased. This is because the constraint layer itself caused a slight contraction when the content of the organic binder is increased, while decreasing the rigidity of the constraint layer to readily cause warp of the constraint layer.

The effect of the content of the organic binder when the thickness of each constraint layer is 0.5 mm will be described below. The examples 90 to 92 in TABLE 6 show that the shrinkage ratio, dimensional irregularity and the degree of warp may be possibly decreased when the content of the organic binder in the first constraint layer 25a is further reduced. The results indicate that the thickness of the constraint layer required for sufficiently reducing the shrinkage ratio, dimensional irregularity and the degree of warp can be decreased to about one third as small as that in the examples 70 to 79.

Fifth Embodiment

The amount of addition of the fibrous inorganic oxide particles in the first constraint layer and in the second constraint layer will be described below.

The case when the amount of addition of the fibrous inorganic oxide particles into the first constraint layer 25a was adjusted to be equal to that in the second constraint layer 25b in FIGS. 6 and 7, or when the rigidity of each constraint layer was made to be equal, will be described first. Fibrous alumina particles with a longitudinal axis length of 50 $\mu$m were used as the fibrous inorganic oxide particles, while the amount of addition of the fibrous inorganic oxide powder in each constraint layer, and the thickness of each constraint layer were changed within a range of 0 to 10% by weight and within a range of 0.5 to 1.8 mm, respectively. The shrinkage ratio, dimensional irregularity and the degree of warp of the ceramic multilayer substrate 26 were determined by the same method as described in the second embodiment. The results of measurements are shown in TABLE 7. The thickness of the multilayer ceramic body was adjusted to be 1 mm in these examples.

TABLE 7

| EXAMPLE | AMOUNT OF ADDITION OF FIBROUS INORGANIC PARTICLES (% BY WEIGHT) | | RATIO OF THICKNESS | SHRINKAGE RATIO (%) | DIMENSIONAL DISTRIBUTION (%) | DEGREE OF WARP ($\mu$m/INCH$^2$) |
|---|---|---|---|---|---|---|
| | FIRST CONSTRAINT LAYER | SECOND CONSTRAINT LAYER | | | | |
| 93 | 20 | 20 | 1.8 | 0.10 | 0.10 | 15 |
| 94 | 15 | 15 | 1.8 | 0.10 | 0.10 | 15 |
| 95 | 10 | 10 | 1.8 | 0.10 | 0.10 | 15 |

TABLE 7-continued

| | AMOUNT OF ADDITION OF FIBROUS INORGANIC PARTICLES (% BY WEIGHT) | | | | | |
|---|---|---|---|---|---|---|
| EXAMPLE | FIRST CONSTRAINT LAYER | SECOND CONSTRAINT LAYER | RATIO OF THICKNESS | SHRINKAGE RATIO (%) | DIMENSIONAL DISTRIBUTION (%) | DEGREE OF WARP ($\mu$m/INCH$^2$) |
| 96 | 5 | 5 | 1.8 | 0.10 | 0.10 | 15 |
| 97 | 0 | 0 | 1.8 | 0.10 | 0.10 | 15 |
| 98 | 20 | 20 | 1.4 | 0.10 | 0.10 | 15 |
| 99 | 15 | 15 | 1.4 | 0.10 | 0.10 | 15 |
| 100 | 10 | 10 | 1.4 | 0.10 | 0.10 | 15 |
| 101 | 5 | 5 | 1.4 | 0.10 | 0.10 | 15 |
| 102 | 0 | 0 | 1.4 | 0.10 | 0.10 | 15 |
| 103 | 20 | 20 | 1.0 | 0.10 | 0.10 | 15 |
| 104 | 15 | 15 | 1.0 | 0.10 | 0.10 | 15 |
| 105 | 10 | 10 | 1.0 | 0.10 | 0.10 | 20 |
| 106 | 5 | 5 | 1.0 | 0.10 | 0.10 | 30 |
| 107 | 0 | 0 | 1.0 | 0.10 | 0.10 | 40 |
| 108 | 20 | 20 | 0.5 | 0.10 | 0.10 | 25 |
| 109 | 15 | 15 | 0.5 | 0.10 | 0.10 | 30 |
| 110 | 10 | 10 | 0.5 | 0.10 | 0.10 | 40 |
| 111 | 5 | 5 | 0.5 | 0.10 | 0.10 | 50 |
| 112 | 0 | 0 | 0.5 | 0.10 | 0.10 | 70 |
| 113 | 20 | 0 | 0.5 | 0.10 | 0.10 | 15 |
| 114 | 20 | 5 | 0.5 | 0.10 | 0.10 | 15 |
| 115 | 15 | 0 | 0.5 | 0.10 | 0.10 | 15 |
| 116 | 15 | 5 | 0.5 | 0.10 | 0.10 | 15 |

The examples 93 to 112 in TABLE 7 show that the shrinkage ratio, dimensional irregularity and the degree of warp may be possibly decreased at a thickness of each constraint layer of 1.4 mm or more, irrespective of the amount of addition of the fibrous inorganic oxide particles. The shrinkage ratio, dimensional irregularity and the degree of warp can be decreased to some extent by adding 5% by weight or more of the fibrous inorganic oxide particles, even when the thickness of each constraint layer is adjusted to 1.0 mm. The degree of warp of the substrate showed a tendency to decrease as the amount of addition of the fibrous inorganic oxide particles is increased at the thickness of each constraint layer of 0.5 mm. This is because warp of the substrate hardly occurs when the amount of addition of the fibrous inorganic oxide particles is increased.

The optimum amount of addition of the fibrous inorganic oxide particles at a thickness of each constraint layer of 0.5 mm will be described below. The examples 113 to 116 in TABLE 7 show that the shrinkage ratio, dimensional irregularity and the degree of warp can be well decreased when the amount of addition of the fibrous inorganic oxide particles into the first constraint layer is increased, or when the fibrous inorganic oxide particles are added only in the first constraint layer. The thickness of the constraint layer required for sufficiently reducing the shrinkage ratio, dimensional irregularity and the degree of warp can be also decreased to about one half as small as that shown in the examples 93 to 107 by the method as described above.

Sixth Embodiment

The amount of addition of the glass powder to be added in the first and second constraint layers will be described below.

The case when the same amount of the glass powder was added into each constraint layer, or when the rigidity of the first constraint layer 25a was made to be equal to the rigidity of the second constraint layer 25b, will be described first. A borosilicate glass powder was used as the glass powder in this embodiment, and the amount of addition of the glass in each constraint layer relative to all the component in the constraint layer, and the thickness of each constraint layer were changed in a range of 0 to 0.7% by weight and in a range of 0.5 to 1.8 mm, respectively. The shrinkage ratio, dimensional irregularity and the, degree of warp of the ceramic multilayer substrate 26 obtained by the same method as used in the second embodiment were measured, and the results are shown in TABLE 8 below. The thickness of the multilayer ceramic body 23 was adjusted to be 1 mm in this embodiment.

TABLE 8

| | AMOUNT OF ADDITION OF GLASS POWDER (% BY WEIGHT) | | | | | |
|---|---|---|---|---|---|---|
| EXAMPLE | FIRST CONSTRAINT LAYER | SECOND CONSTRAINT LAYER | RATIO OF THICKNESS | SHRINKAGE RATIO (%) | DIMENSIONAL DISTRIBUTION (%) | DEGREE OF WARP ($\mu$m/INCH$^2$) |
| 117 | 0 | 0 | 1.8 | 0.10 | 0.10 | 15 |
| 118 | 0.1 | 0.1 | 1.8 | 0.10 | 0.10 | 15 |
| 119 | 0.3 | 0.3 | 1.8 | 0.10 | 0.10 | 15 |

TABLE 8-continued

| | AMOUNT OF ADDITION OF GLASS POWDER (% BY WEIGHT) | | | | | |
|---|---|---|---|---|---|---|
| EXAMPLE | FIRST CONSTRAINT LAYER | SECOND CONSTRAINT LAYER | RATIO OF THICKNESS | SHRINKAGE RATIO (%) | DIMENSIONAL DISTRIBUTION (%) | DEGREE OF WARP ($\mu$m/INCH$^2$) |
| 120 | 0.5 | 0.5 | 1.8 | 0.10 | 0.10 | 15 |
| 121 | 0.7 | 0.7 | 1.8 | 0.10 | 0.10 | 20 |
| 122 | 0 | 0 | 1.4 | 0.10 | 0.10 | 15 |
| 123 | 0.1 | 0.1 | 1.4 | 0.10 | 0.10 | 15 |
| 124 | 0.3 | 0.3 | 1.4 | 0.10 | 0.10 | 15 |
| 125 | 0.5 | 0.5 | 1.4 | 0.10 | 0.10 | 15 |
| 126 | 0.7 | 0.7 | 1.4 | 0.12 | 0.10 | 40 |
| 127 | 0 | 0 | 1.0 | 0.10 | 0.10 | 40 |
| 128 | 0.1 | 0.1 | 1.0 | 0.10 | 0.10 | 20 |
| 129 | 0.3 | 0.3 | 1.0 | 0.10 | 0.10 | 20 |
| 130 | 0.5 | 0.5 | 1.0 | 0.10 | 0.10 | 30 |
| 131 | 0.7 | 0.7 | 1.0 | 0.12 | 0.10 | 40 |
| 132 | 0 | 0 | 0.5 | 0.10 | 0.10 | 70 |
| 133 | 0.1 | 0.1 | 0.5 | 0.10 | 0.10 | 30 |
| 134 | 0.3 | 0.3 | 0.5 | 0.10 | 0.10 | 25 |
| 135 | 0.5 | 0.5 | 0.5 | 0.10 | 0.10 | 50 |
| 136 | 0.7 | 0.7 | 0.5 | 0.13 | 0.11 | 120 |
| 137 | 0.5 | 0 | 0.5 | 0.10 | 0.10 | 20 |
| 138 | 0.3 | 0 | 0.5 | 0.10 | 0.10 | 15 |
| 139 | 0.1 | 0 | 0.5 | 0.10 | 0.10 | 20 |

The examples 117 to 136 in TABLE 8 show that the shrinkage ratio, dimensional irregularity and the degree of warp may be well reduced at a thickness of each constraint layer of 1.4 mm or more when the amount of addition of the glass powder is 0.5% or less. While the degree of warp of the substrate is reduced by adding the glass powder at a thickness of each constraint layer of 1.0 mm or less, the degree of warp and the shrinkage ratio showed increasing tendencies when the amount of addition of the glass powder is increased to 0.5% by weight or more. This is because, while the rigidity of the constraint layer increases by, adding the glass powder into the constraint layer, the constraint layer itself is slightly contracted by adding a given amount or more of the glass powder.

The amount of addition of the glass powder into each constraint layer will be then described at a thickness of each constraint layer of 0.5 mm. The examples 137 to 139 in TABLE 8 show that the shrinkage ratio, dimensional irregularity and the degree of warp may be suppressed by adding the glass powder only in the first constraint layer 25a. It was also possible by the process above to reduce the thickness of the constraint layer required for sufficiently suppress the degree of warp to about one third as small as that in the examples 117 to 126.

Contraction of the non-sintered ceramic body along the X-Y directions, or contraction along the directions on the substrate plane, during sintering may be sufficiently suppressed by forming the first constraint layer having a larger rigidity on one major surface side having a larger shrinkage ratio by firing as described above. The degree of warp of the substrate can be also sufficiently decreased while restricting the thickness of the constraint layer to its minimum essential thickness. Consequently, dimensional accuracy of the ceramic substrate can be improved besides suppressing the problem of wiring breakage thanks to the small degree of warp of the substrate when a fine and highly integrated wiring pattern is formed.

While the present invention has been described based on the first to sixth embodiments, the present invention is not necessarily restricted to the embodiments as set forth above, but various modifications thereof are possible.

Figure 8:
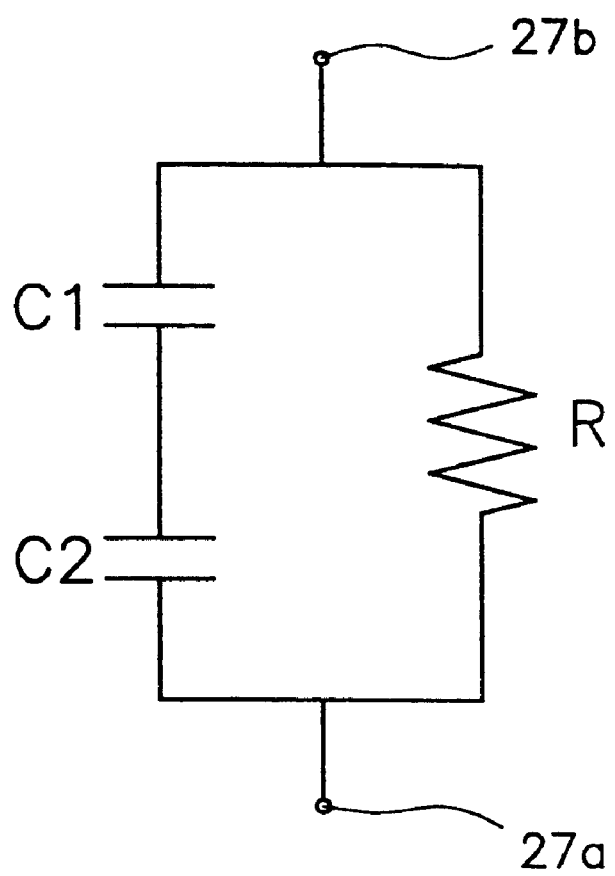
FIG. 8 shows an equivalent circuit diagram of the ceramic multilayer substrate as described above.

For example, the equivalent circuits shown in FIGS. 5 and 8 are merely typical examples for allowing the present invention to be easily comprehended. Instead, the method for manufacturing the ceramic substrate according to the present invention may be equally applied for other ceramic multilayer substrate containing a variety of circuit designs. Various surface-mounting members such as laminated ceramic capacitors and semiconductor devices may be also mounted on the ceramic substrate obtained. The molded block to be integrated into the non-sintered ceramic body is not restricted to elementary members such as capacitors and inductors, but it may be a molded block of a LC composite member.

The method for manufacturing the ceramic substrate according to the present invention can be applied for various module substrates such as IC package substrates and hybrid IC substrates, as well as for manufacturing laminated chip members such as multilayer filters, multilayer chip antennas and multilayer ceramic capacitors.

The method for manufacturing the ceramic substrate according to the present invention is favorably applied for the non-sintered ceramic body as a precursor of the ceramic substrate comprising laminated green sheets (a multilayer ceramic body) prepared by laminating the green sheets comprising conductor patterns, wherein (1) the degree of integration of the conductor pattern is different at the upper side and lower side with respect to the center face located at the same distance from both major surfaces of the laminated ceramic green sheets, (2) plural kinds of the ceramic green sheets having mutually different compositions are laminated, and (3) plural kinds of the ceramic green sheets having mutually different thicknesses are laminated. otherwise, the non-sintered ceramic body constructed as described above is liable to cause warp and distortion ascribed to the difference of the degree of contraction by firing at the upper and lower sides of the non-sintered ceramic body.

More practically, the constraint layer having a higher rigidity may be applied on the side having a higher degree of integration of the semiconductor pattern, because the laminated body tends to form concave warp toward the side having a higher degree of integration of the semiconductor pattern when the ceramic laminated body has different degree of integration on the upper side and lower side with respect to the center face located at the same distance from both major surfaces of the green sheet laminated body. When the green sheet laminated body comprises laminated plural kinds of ceramic green sheets having mutually different compositions (ceramic green sheets having different compositions and particle sizes of the ceramic), a constraint layer having a higher rigidity may be applied on the side capable of being more largely contracted during firing with respect to the center face located at an equal distance from the both major surfaces of the green sheet laminated body. When the ceramic laminated body comprises laminated plural kinds of the ceramic green sheets having mutually different thicknesses, the constraint layer having a higher rigidity may be applied on the side representing a thicker green sheet because the ceramic green sheet may :be more largely contracted when it is thicker.

While the rigidity of each constraint layer may be appropriately selected by repeated try-and-error, it is desirable to select such rigidity as is able to minimize the degree of warp of the substrate by predicting, for example, the relations between the degree of integration of the conductor pattern and the degree of warp, between the composition of the ceramic green sheet and the degree of warp of the substrate, and between the thickness of the ceramic green sheet and the degree of warp of the substrate, as well as the relation between the degree of warp of the substrate and rigidity of the constraint layer.

The present invention relates to a non-fired ceramic substrate prepared by adhering a first constraint layer and second constraint layer on one major surface and the other major surface, respectively, of a non-sintered ceramic body comprising a conductor pattern, the first and second constraint layers mainly comprising an inorganic powder that is not sintered at the sintering condition of the non-sintered ceramic body and having different rigidity one another. Rigidity of the first constraint layer and the second constraint layer is appropriately selected based on the first to fifth methods as hitherto described.

In the method for manufacturing the ceramic substrate according to the present invention, the first constraint, layer and the second constraint layer is adhered on one major surface and the other major surface, respectively, of the non-sintered ceramic body comprising a conductor pattern, the first and second constraint layers mainly comprising an inorganic powder that is not sintered under the sintering condition of the non-sintered ceramic body, and each constraint layer is removed after firing under the sintering condition of the non-sintered ceramic body. The rigidity of the first constraint layer and the rigidity of the second constraint layer may be different one another and may be appropriately selected so as to suppress deformation of the ceramic substrate by firing. Consequently, a ceramic substrate having an excellent dimensional accuracy can be efficiently manufactured by suppressing firing contraction along the directions on the substrate plane, besides suppressing substrate deformation such as warp of the substrate.

Making the first constraint layer to have higher rigidity than the second constraint layer, and allowing the first constraint layer to adhere on one major surface that may be more largely contract by firing, make it possible to sufficiently suppress warp and distortion of the substrate ascribed to differences of contraction between one major surface and the other major surface of the non-sintered ceramic body, thereby allowing a ceramic substrate having an excellent dimensional accuracy to be readily and efficiently manufactured by sufficiently suppressing deformation of the substrate without using any special firing equipment.

Since the constraint layer should not have film thickness more than necessary, the manufacturing cost required for the constraint layer is depressed and peeling and removal of the constraint layer after firing turn out to be quite easy. Moreover, since the organic binder in the constraint layer and in the non-sintered ceramic body is smoothly volatilized, the firing time is shortened to reduce irregular firing and to suppress generation of pores due to residues of the organic binder, thereby enabling a high quality ceramic substrate to be manufactured.

While the invention has been particularly shown and described with reference to preferred embodiments thereof, it will be understood by those skilled in the art that the forgoing and other changes in form and details may be made therein without departing from the spirit of the invention.

What is claimed is:

1. A method for manufacturing a multilayered ceramic body having conductor patterns, comprising:

a adhering a first constraint layer on a first major surface of a non-sintered multilayered ceramic body, the first constraint layer being mainly composed of a first inorganic powder that is not sintered under the sintering condition of the non-sintered multilayered ceramic body;

adhering a second constraint layer on a second major surface of the non-sintered multilayered ceramic body, the second constraint layer having different rigidity from the first constraint layer and being mainly composed of a second inorganic powder that is not sintered under the sintering condition of the non-sintered multilayered ceramic body; and firing the non-sintered multilayered ceramic body to sinter the non-sintered multilayer ceramic body.

2. The method for manufacturing a multilayered ceramic body according to claim 1, wherein the first constraint layer has a higher rigidity than that of the second constraint layer, said first constraint layer being adhered on one of the first and second major surfaces that is able to be largely contracted by firing.

3. The method for manufacturing a multilayered ceramic body according to claim 1, wherein the first constraint layer has a thickness larger than the thickness of the second constraint layer.

4. The method for manufacturing a multilayered ceramic body according to claim 3, wherein the first constraint layer has a thickness three times or less as large as the thickness of the second constraint layer.

5. The method for manufacturing a multilayered ceramic body according to claim 1, wherein the mean particle size of the inorganic oxide power in the first constraint layer is smaller than the mean particle size of the inorganic oxide powder in the second constraint layer.

6. The method of manufacturing a multilayered ceramic body according to claim 1, wherein the first constraint layer and the second constraint layer are formed by dispersing the first and second inorganic powders in respective organic binders, the content of the organic binder in the first constraint layer being smaller than the content of the organic binder in the second constraint layer.

7. The method for manufacturing a multilayered ceramic body according to claim 1, wherein the first constraint layer contains fibrous inorganic oxide particles.

8. The method of manufacturing a multilayered ceramic body according to claim 1, wherein the first constraint layer contains a glass powder that does not exhibit viscous fluidity under the sintering condition of the non-sintered ceramic multilayered body in the first constraint layer.

9. The method for manufacturing a multilayered ceramic body according to claim 1, wherein the first constraint layer and the second constraint layer serve as ceramic green sheets comprising an inorganic oxide powder dispersed into an organic binder.

10. The method for manufacturing a multilayered ceramic body according to claim 1, wherein the non-sintered multilayered ceramic body comprises laminated green sheets prepared by laminating ceramic green sheets having the conductive patterns, the degree of integration of the conductor patterns being different between the upper side and lower side with respect to the center face located at an equal distance from the both major surfaces of the laminated member of the ceramic green sheets.

11. The method for manufacturing a multilayered ceramic body according to claim 1, wherein the non-sintered multilayered ceramic body comprises laminated green sheets prepared by laminating ceramic green sheets having the conductor patterns, plural kinds of ceramic green sheets having mutually different compositions being laminated in the non-sintered multilayered ceramic body.

12. The method for manufacturing a multilayered ceramic body according to claim 1, wherein the non-sintered multilayered ceramic body comprises laminated green sheets prepared by a laminating ceramic green sheets having the conductor patterns, plural kinds of ceramic green sheets having mutually different thicknesses being laminated in the non-sintered multilayered ceramic body.

13. The method for manufacturing a multilayered ceramic body according to claim 1, wherein at least one kind of passive member selected from the group consisting of a capacitor, an inductor and a resistor is integrated into the non-sintered multilayered ceramic body.

14. The method for manufacturing a multilayered ceramic body according to claim 13, wherein the capacitor or the inductor is integrated into the non-sintered multilayered ceramic body as a block member.

15. The method for manufacturing a multilayered ceramic body according to claim 1, wherein the non-sintered multilayered ceramic body is fired at a firing temperature of 1000° C. or below.

16. The method for manufacturing a multilayered ceramic body according to claim 1, wherein the non-sintered multilayered ceramic body is fired without applying any load.

17. The method for manufacturing a multilayered ceramic body according to claim 1, wherein each of the first and second constraint layers is removed after firing.

18. The method for manufacturing a multilayered ceramic body according to claim 1, wherein the non-sintered multilayered ceramic body is a non-sintered multilayered ceramic filter, a non-sintered multilayered ceramic chip antenna, or a non-sintered multilayered ceramic capacitor.

19. A non-fired multilayered ceramic body, comprising:
 a non-sintered multilayered ceramic body having a first major surface and a second major surface; and
 a first constraint layer adhered to the first major surface and a second constraint layer adhered to the second major surface, wherein the first constraint layer and the second constraint layer contain inorganic powder that is not sintered under the sintering condition of the non-sintered multilayered ceramic body as a principal component, and have different rigidities from one another.

* * * * *